(12) United States Patent
Huang et al.

(10) Patent No.: US 8,835,258 B2
(45) Date of Patent: Sep. 16, 2014

(54) HIGH VOLTAGE DEVICE AND MANUFACTURING METHOD THEREOF

(71) Applicants: Tsung-Yi Huang, HsinChu (TW); Huan-Ping Chu, Hsinchu (TW)

(72) Inventors: Tsung-Yi Huang, HsinChu (TW); Huan-Ping Chu, Hsinchu (TW)

(73) Assignee: Richtek Technology Corporation, R.O.C., Chupei, Hsin-Chu (TW)

( * ) Notice: Subject to any disclaimer, the term of this patent is extended or adjusted under 35 U.S.C. 154(b) by 80 days.

(21) Appl. No.: 13/844,926

(22) Filed: Mar. 16, 2013

(65) Prior Publication Data

US 2013/0217196 A1 Aug. 22, 2013

Related U.S. Application Data

(62) Division of application No. 13/197,370, filed on Aug. 3, 2011, now Pat. No. 8,421,150.

(51) Int. Cl.
| | |
|---|---|
| *H01L 21/336* | (2006.01) |
| *H01L 29/78* | (2006.01) |
| *H01L 29/08* | (2006.01) |
| *H01L 29/66* | (2006.01) |
| *H01L 29/10* | (2006.01) |
| *H01L 29/423* | (2006.01) |

(52) U.S. Cl.
CPC ...... *H01L 29/66681* (2013.01); *H01L 29/7835* (2013.01); *H01L 29/0847* (2013.01); *H01L 29/66659* (2013.01); *H01L 29/1083* (2013.01); *H01L 29/42368* (2013.01)
USPC ........... 438/270; 438/271; 438/286; 257/335; 257/339; 257/341

(58) Field of Classification Search
CPC .............. H01L 29/66681; H01L 29/66; H01L 29/66712
USPC .......... 438/270–271, 286; 257/335, 339, 341, 257/343
See application file for complete search history.

(56) References Cited

U.S. PATENT DOCUMENTS

| | | | |
|---|---|---|---|
| 6,946,705 B2 * | 9/2005 | Kitaguchi | 257/335 |
| 8,525,259 B2 * | 9/2013 | Takeda et al. | 257/339 |

* cited by examiner

*Primary Examiner* — Theresa T Doan
(74) *Attorney, Agent, or Firm* — Tung & Associates

(57) ABSTRACT

The present invention discloses a high voltage device and a manufacturing method thereof. The high voltage device is formed in a first conductive type substrate, wherein the substrate has an upper surface. The high voltage device includes: a second conductive type buried layer, which is formed in the substrate; a first conductive type well, which is formed between the upper surface and the buried layer; and a second conductive type well, which is connected to the first conductive type well and located at different horizontal positions. The second conductive type well includes a well lower surface, which has a first part and a second part, wherein the first part is directly above the buried layer and electrically coupled to the buried layer; and the second part is not located above the buried layer and forms a PN junction with the substrate.

5 Claims, 4 Drawing Sheets

HIGH VOLTAGE DEVICE AND MANUFACTURING METHOD THEREOF

BACKGROUND OF THE INVENTION

1. Field of Invention

The present invention relates to a high voltage device and a manufacturing method of a high voltage device; particularly, it relates to such device and manufacturing method wherein the breakdown voltage is increased.

2. Description of Related Art

FIG. 1 shows a cross-section view of a prior art horizontal double diffused metal oxide semiconductor (LDMOS) device. As shown in FIG. 1, a P-type substrate 11 has multiple isolation regions 12 by which a device region 100 is defined. The isolation region 12 for example is formed by a shallow trench isolation (STI) process or a local oxidation of silicon (LOCOS) process, the latter being shown in the figure. The P-type substrate 11 also includes an N-type buried layer 14. The LDMOS device is formed in the device region 100, which includes a gate 13, a drain 15, a source 16, a P-type well 17, and an N-type well 18 besides the buried layer 14. The buried layer 14, the drain 15, the source 16, and the N-type well 18 are formed by a lithography process and an ion implantation process, wherein the lithography process defines the implantation regions by a photoresist mask together with a self-alignment effect provided by all or part of the gate 13 and the isolation regions 12, and the ion implantation implants N-type impurities to the defined regions in the form of accelerated ions. The P-type well 17 is formed by a lithography process and an ion implantation process, wherein the lithography process defines the implantation regions by a photoresist mask, and the ion implantation implants P-type impurities to the defined regions in the form of accelerated ions. The drain 15 and the source 16 are beneath the gate 13 and at different sides thereof respectively. Part of the gate 13 is above a field oxide region 22 in the LDMOS device.

FIG. 2 shows a cross-section view of a prior art double diffused drain metal oxide semiconductor (DDDMOS) device. The DDDMOS device is different from the prior art LDMOS device in that, a gate 13a is entirely above the surface of the substrate 11 without any part above the field oxide region 22.

The LDMOS device and the DDDMOS device are high voltage devices designed for applications requiring higher operation voltages. However, if it is required for the LDMOS device or the DDDMOS device to be integrated with a low voltage device in one substrate, the high voltage device and the low voltage device should adopt the same manufacturing process steps with the same ion implantation parameters, and thus the flexibility of the ion implantation parameters for the LDMOS device or the DDDMOS device is limited; as a result, the LDMOS device or the DDDMOS device will have a lower breakdown voltage and therefore a limited application range. To increase the breakdown voltage of the LDMOS device and the DDDMOS device, additional manufacturing process steps are required, that is, an additional lithography process and an additional ion implantation process are required in order to provide different ion implantation parameters, but this increases the cost.

In view of above, to overcome the drawbacks in the prior art, the present invention proposes a high voltage device and a manufacturing method thereof which provide a higher breakdown voltage so that the high voltage device may have a broader application range, in which additional manufacturing process steps are not required such that the high voltage device can be integrated with and a low voltage device and manufactured by common manufacturing process steps.

SUMMARY OF THE INVENTION

The first objective of the present invention is to provide a high voltage device.

The second objective of the present invention is to provide a manufacturing method of a high voltage device.

To achieve the objectives mentioned above, from one perspective, the present invention provides a high voltage device, which is formed in a first conductive type substrate, wherein the substrate has an upper surface, the high voltage device including: a second conductive type buried layer, which is formed in the substrate; a first conductive type well, which is formed between the upper surface and the buried layer from cross-section view; and a second conductive type well, which is formed beneath the upper surface, the second conductive type well being connected to the first conductive type well and located at a different horizontal position from the first conductive type well, wherein the second conductive type well includes a well lower surface, which has a first part and a second part, wherein the first part is located above the buried layer and electrically coupled to the buried layer, and the second part forms a PN junction with the substrate and is not directly above the buried layer.

From another perspective, the present invention provides a manufacturing method of a high device, including: providing a first conductive type substrate having an upper surface; forming a second conductive type buried layer in the substrate; forming a first conductive type well between the upper surface and the buried layer from cross-section view; and forming a second conductive type well beneath the upper surface, the second conductive type well being connected to the first conductive type well and located at a different horizontal position from the first conductive type well, wherein the second conductive type well includes a well lower surface, which has a first part and a second part, wherein the first part is located above the buried layer and electrically coupled to the buried layer, and the second part forms a PN junction with the substrate and is not directly above the buried layer.

In one preferable embodiment of the high voltage device, the second conductive type well is substantially depleted when the high voltage device operates in an OFF condition.

In another embodiment, the high voltage device preferably further includes a second conductive type drift region, which is located in the second conductive type well, between the first conductive type well and a drain in horizontal direction, wherein the drift region is fully depleted when the high voltage device operates in an OFF condition.

In yet another embodiment, the high voltage device preferably is a horizontal double diffused metal oxide semiconductor (LDMOS) device or a double diffused drain metal oxide semiconductor (DDDMOS) device.

In yet another embodiment, the substrate preferably includes a first conductive type bare substrate, a first conductive type buried layer formed by implanting first conductive type impurities in the form of accelerated ions, or a first conductive type epitaxial layer formed by epitaxial growth.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
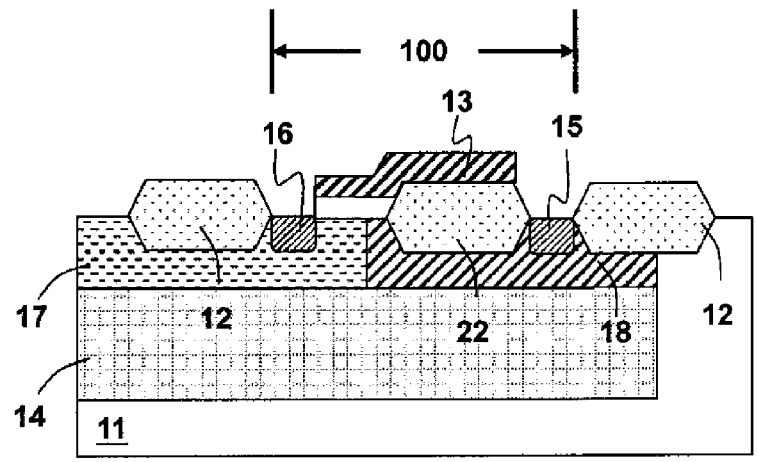
FIG. 1 shows a cross-section view of a conventional LDMOS device.
Figure 2:
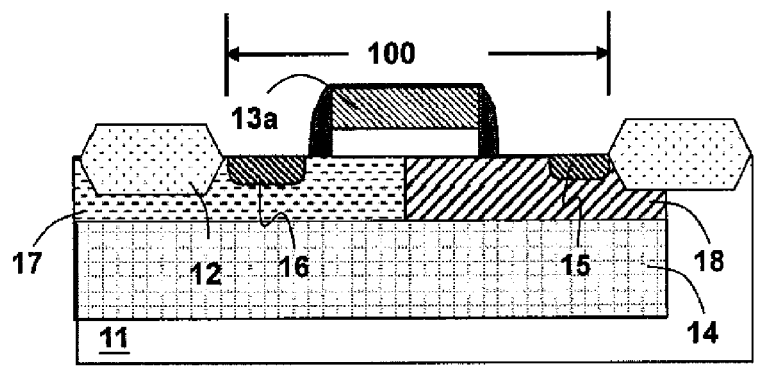
FIG. 2 shows a cross-section view of the conventional DDDMOS device.
Figure 3:
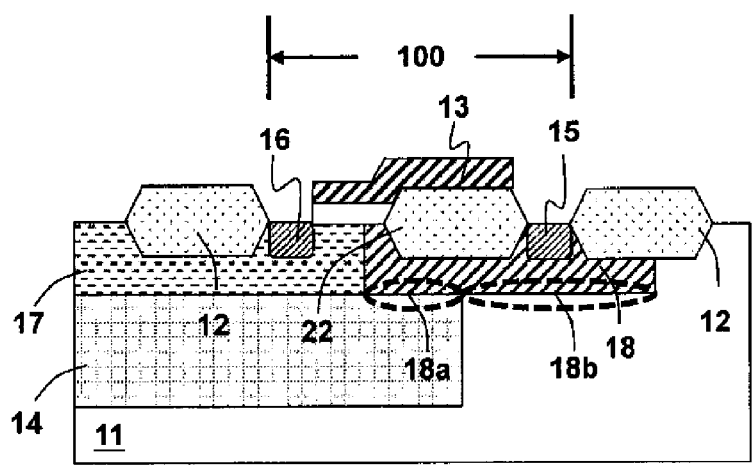
FIG. 3 shows a first embodiment of the present invention.

Please refer to FIG. 3 for a first embodiment according to the present invention, wherein an LDMOS device according to the present invention is illustrated in the figure. In a substrate 11, isolation regions 12 are formed to define a device region 100, wherein the substrate 11 is, for example but not limited to, a P-type substrate (or an N-type substrate in another embodiment), and the isolation regions 12 are formed, for example, by an STI or LOCOS process (the latter being shown in the figure). And as shown in FIG. 3, the substrate 11 includes an N-type buried layer 14 (or a P-type buried layer in another embodiment), which has a different conductive type from the substrate 11. Further, as shown in FIG. 3, a P-type well 17 (or an N-type well in another embodiment) and an N-type well 18 (or a P-type well in another embodiment) are formed in the substrate 11, wherein the P-type well 17 is formed between the upper surface of the substrate 11 and the buried layer 14 from the cross-section view. The N-type well 18 is formed beneath the upper surface of the substrate 11, and the N-type well 18 is connected to the P-type well 17 and located at a different horizontal position from the P-type well 17. A field oxide region 22 is formed in the device region 100, wherein the field oxide region 22 is formed, for example, by an STI or LOCOS process, and it is preferably but not limited to being formed by the same process steps as the isolation regions 12. As shown in FIG. 3, a gate 13, drain 15, and source 16 are formed in the device region 100, wherein the source 16 and drain 15 are, for example but not limited to, N-type (the source 16 and drain 15 may be P-type in another embodiment), and are formed at two sides of the gate 13 in the device region 100 respectively, separated by the gate 13 and the field oxide region 22 from top view (not shown).

This embodiment is different from the prior art in that, in this embodiment, the lower surface of the N-type well 18 has a first part 18a and a second part 18b, which are respectively indicated by the dashed line circles shown in FIG. 3, wherein the first part 18a is located above the buried layer 14 and electrically coupled to the buried layer 14, and the second part 18b is not directly above the buried layer 14; the second part 18b forms a PN junction with the substrate 11.

This arrangement has the following advantages: First, the high voltage device of the present invention has better characteristics because the present invention enhances the breakdown voltage of the high voltage device. The reason will be described in details later. Second, in manufacturing process, no additional process step or mask is required, that is, the structure can simply be formed by masking the area corresponding to the second part 18b by a photoresist mask or other masks during the ion implantation step for forming the buried layer 14. As such, the high voltage device in the present invention has a better breakdown voltage while it can be manufactured by a low cost.

Figure 4:
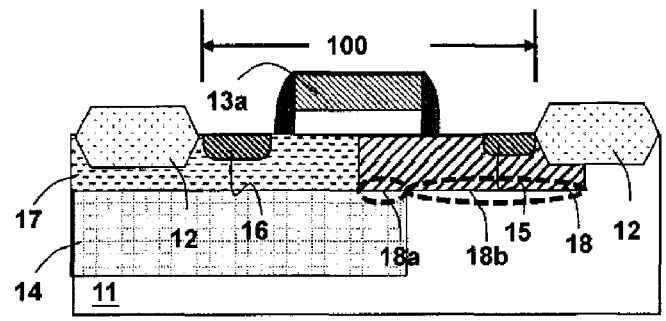
FIG. 4 shows a second embodiment of the present invention.

FIG. 4 shows a second embodiment of the present invention. This embodiment is different from the first embodiment in that, this embodiment is a DDDMOS device instead of the LDMOS device. The DDDMOS shown in the figure has a gate 13a, which is entirely above the surface of the substrate 11 without any part above the field oxide region 22.

Figure 5A:
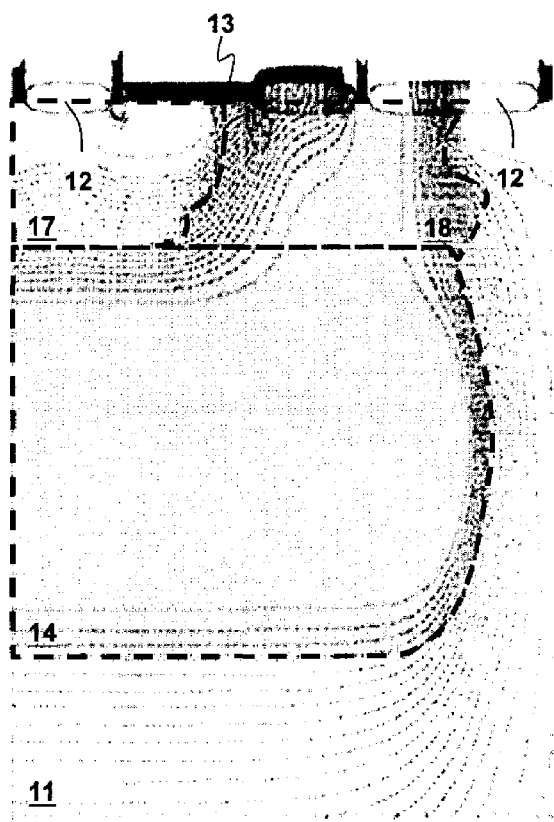
FIGS. 5A and 5B show simulations of the electric field of the high voltage devices of the prior art and the present invention in an OFF condition respectively.
Figure 5B:
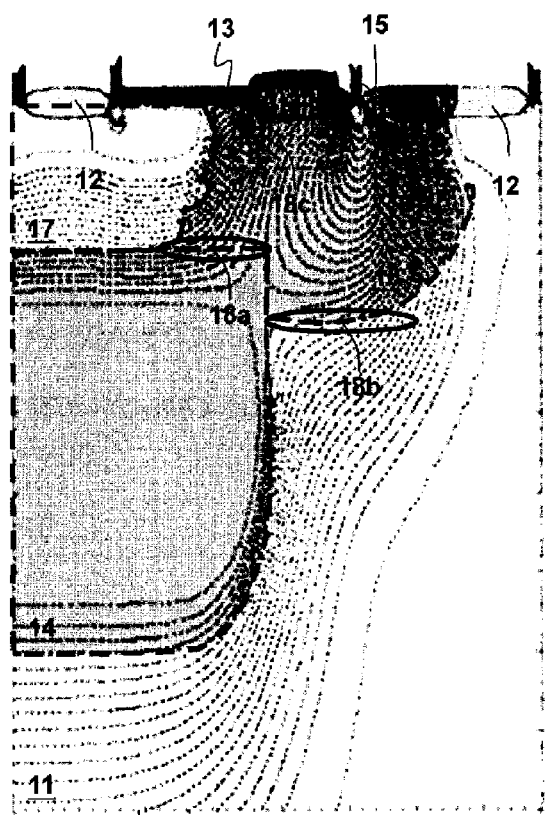

FIGS. 5A and 5B show simulations of the electric field of the high voltage devices of the prior art and the first embodiment of the present invention in the OFF condition respectively. The simulations show how the breakdown voltage of the high voltage device in the present invention is enhanced as compared with the prior art. FIG. 5A shows the electric field simulation of the prior art high voltage device in the OFF condition. When the N-type LDMOS device shown in FIG. 5A operates in the OFF condition, wherein the voltage applied to the gate 13 is for example at zero level, the junctions between the P-type well 17 and the N-type buried layer 14, between the P-type well 17 and the N-type well 18, and between the N-type well 18 and the P-type substrate 11 are all reverse biased; depletion regions with different widths are generated at these junctions, as indicated by electric field lines shown in FIG. 5A, and those regions without any electric field line are at zero level.

FIG. 5B shows the electric field simulation of the LDMOS device according to the first embodiment of the present invention in the OFF condition. It is different from FIG. 5A in that, because the lower surface of the N-type well 18 has the first part 18a coupled to the N-type buried layer 14, and the second part 18b coupled to the P-type substrate 11, a reverse biased PN junction between the second part 18b and the substrate 11 is formed in the OFF condition. As shown by the distribution of the electric field lines in FIG. 5B, the N-type well 18 is fully depleted because the three junctions between the P-type well 17 and the N-type well 18, between the side surface of the N-type well 18 and the P-type substrate 11, and between the second part 18b and the P-type substrate 11 are all reversely biased.

Comparing FIG. 5A with 5B, it can be realized that when the high voltage device according to the present invention operates in the OFF condition, the N-type well 18 is substantially fully depleted, as shown in FIG. 5B. Therefore, it can sustain a higher operation voltage, i.e., the breakdown voltage is higher. This illustrates that the the present invention has the advantage of enhancing the breakdown voltage. In FIG. 5B, a dashed line rectangle indicates an N-type drift region 18c, which is located in the N-type well 18. The drift region 18c may be formed by, but not limited to, the same process steps of forming the N-type well 18, and the drift region 18c is defined between the P-type well 17 and the drain 15 in horizontal direction. When the high voltage device of the present invention operates in the OFF condition, the N-type drift region 18c is fully depleted to enhance the breakdown voltage. Note that the N-type drift region 18c is a current path in an ON condition of the high voltage device, and it is adjacent to the drain 15 where the high operation voltage is applied to, so the drift region 18c is a region where the breakdown happens most easily.

Figure 6A:
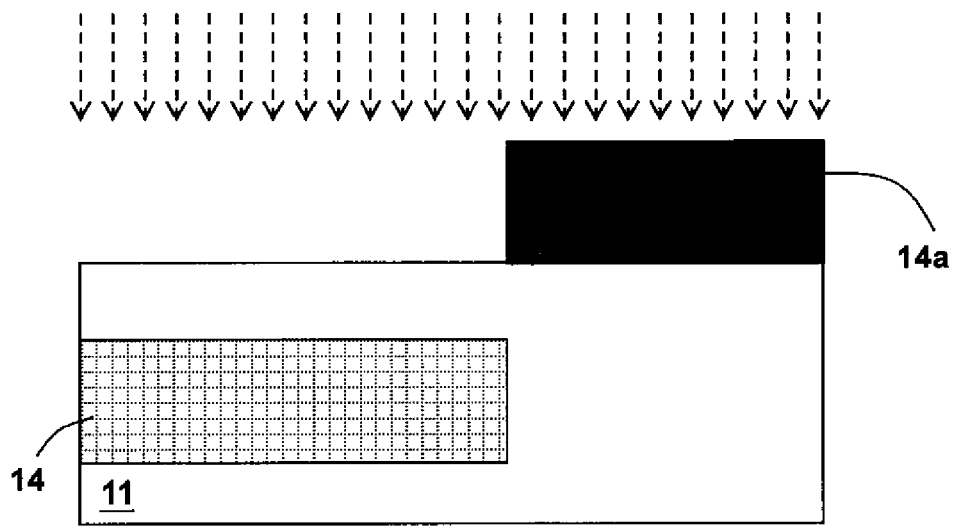
FIGS. 6A-6D show a manufacturing method of a high voltage device of the present invention.

FIGS. 6A-6D for describe an embodiment of a manufacturing method for making the high voltage device of the present invention. As shown in FIG. 6A, a substrate for example but not limited to the P-type substrate 11 (or an N-type substrate in another embodiment) is provided, which has an upper surface. In the P-type substrate 11, the N-type buried layer 14 is formed by masking the P-type substrate 11 with a mask 14a such as a photoresist layer, and implanting N-type impurities in the form of accelerated ions as indicated by the dashed arrow lines.

Figure 6B:
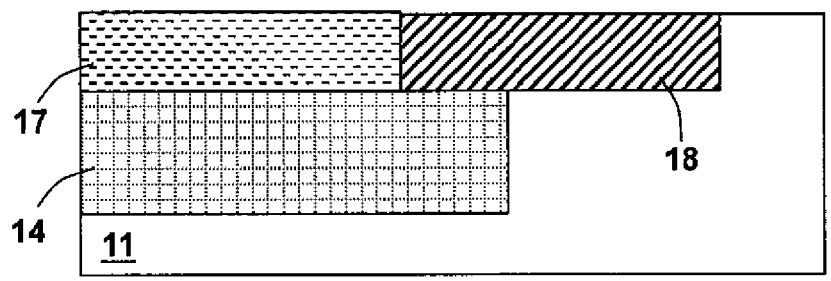

FIG. 6B shows that the P-type well 17 and the N-type well 18 are defined by photoresist or other type of masks and formed by implanting P-type impurities and N-type impurities, respectively. The P-type well 17 is located between the upper surface of the substrate 11 and the N-type buried layer 14. The N-type well 18 is located beneath the upper surface of the substrate 11, connected to the P-type well 17, but is located at a different horizontal position from the P-type well 17, as shown by the cross-section view of FIG. 6B.

Figure 6C:
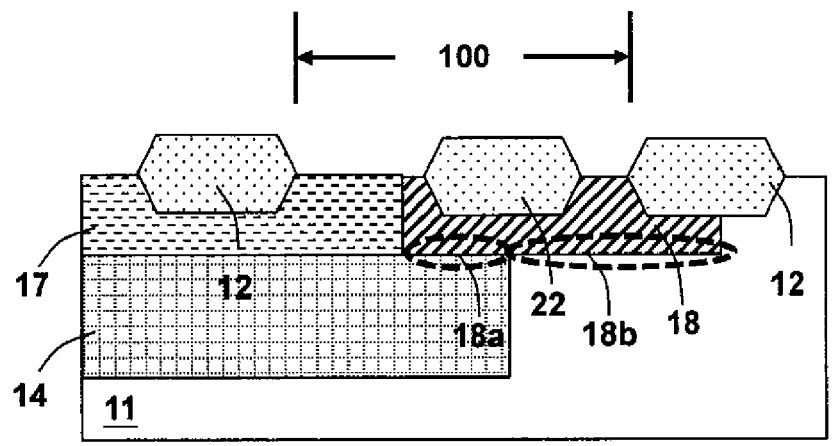

FIG. 6C shows that the isolation regions 12 are formed to define a device region 100 in the substrate 11, and in a preferred but not limiting embodiment, the same process steps for forming the isolation regions 12 are used to form the field oxide region 22. The N-type well 18 includes a well lower surface which has a first part 18a and a second part 18b, wherein the first part 18a is located above the N-type buried layer 14 and electrically coupled to the buried layer 14, and the second part 18b is not directly above the buried layer 14. The second part 18b forms a PN junction with the substrate 11.

Figure 6D:
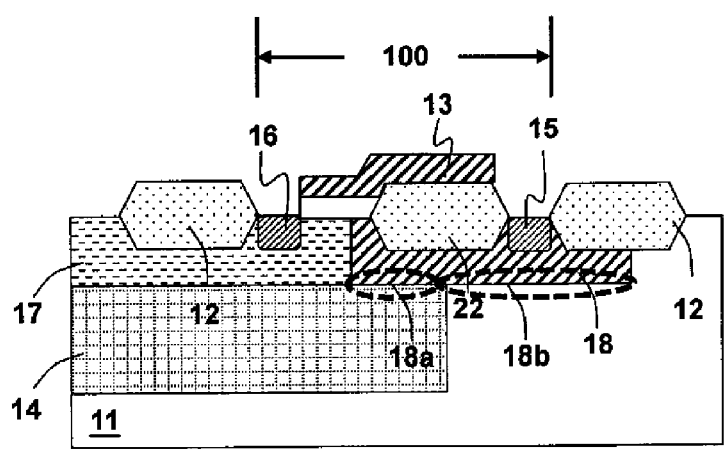

Referring to FIG. 6D, the gate 13, the drain 15, and the source 16 are formed in the device region 100. The drain 15 and the source 16 are N-type in this embodiment (or P-type in another embodiment). The drain 15 and the source 16 are beneath the gate 13 and at different sides thereof respectively. The drain 15 and the source 16 are separated by the gate 13 and the field oxide region 22 from top view.

Note that the P-type substrate 11 described in the above embodiments can be, but is not necessarily a P-type bare substrate, that is, a P-type wafer may be used to form the substrate 11. In other embodiments, the P-type substrate 11 may be a P-type buried layer, for example but not limited to being formed by ion implantation; or the P-type substrate 11 may be a P-type epitaxial layer, formed by epitaxial growth.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above can be replaced by electron beam lithography, X-ray lithography, etc. For yet another example, the N-type well 18 does not need to be fully depleted; it can enhance the breakdown voltage even only partially depleted. In view of the foregoing, the spirit of the present invention should cover all such and other modifications and variations, which should be interpreted to fall within the scope of the following claims and their equivalents.

What is claimed is:

1. A manufacturing method of a high voltage device, comprising:
    providing a first conductive type substrate having an upper surface;
    forming a second conductive type buried layer in the substrate;
    forming a first conductive type well between the upper surface and the buried layer from cross-section view; and
    forming a second conductive type well beneath the upper surface, the second conductive type well having one side extending below a gate of the high voltage device and another side extending beyond a drain of the high voltage device, and the second conductive type well being connected to the first conductive type well and located at a different horizontal position from the first conductive type well, wherein the second conductive type well includes a well lower surface, which has a first part and a second part, wherein the first part is located above the buried layer and electrically coupled to the buried layer, and the second part forms a PN junction with the substrate and is not directly above the buried layer, and wherein the second conductive type well including an area beyond the drain is substantially depleted when the high voltage device operates in an OFF condition.

2. The manufacturing method of claim 1, wherein when the second conductive type well is substantially depleted, a depletion area in the second part extends deeper than a level of an upper surface of the second conductive type buried layer.

3. The manufacturing method of claim 1, further comprising forming a second conductive type drift region in the second conductive type well, between the first conductive type well and a drain in horizontal direction, wherein the drift region is fully depleted when the high voltage device operates in an OFF condition.

4. The manufacturing method of claim 1, wherein the high voltage device is a horizontal double diffused metal oxide semiconductor (LDMOS) device or a double diffused drain metal oxide semiconductor (DDDMOS) device.

5. The manufacturing method of claim 1, wherein the substrate includes a first conductive type bare substrate, a first conductive type buried layer formed by implanting first conductive type impurities in the form of accelerated ions, or a first conductive type epitaxial layer formed by epitaxial growth.

* * * * *